US006867913B2

(12) United States Patent
Mann et al.

(10) Patent No.: US 6,867,913 B2
(45) Date of Patent: Mar. 15, 2005

(54) 6-MIRROR MICROLITHOGRAPHY PROJECTION OBJECTIVE

(75) Inventors: Hans-Jürgen Mann, Oberkochen (DE); Udo Dinger, Oberkochen (DE); Michael Mühlbeyer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 270 days.

(21) Appl. No.: 09/920,285

(22) Filed: Aug. 1, 2001

(65) Prior Publication Data

US 2002/0056815 A1 May 16, 2002

Related U.S. Application Data

(63) Continuation-in-part of application No. 09/503,640, filed on Feb. 14, 2000, now Pat. No. 6,353,470.
(60) Provisional application No. 60/255,214, filed on Dec. 13, 2000.

(30) Foreign Application Priority Data

Aug. 1, 2000 (DE) .......................................... 100 37 870
Jul. 11, 2001 (EP) .......................................... 01116916

(51) Int. Cl.[7] .............................................. G02B 17/00
(52) U.S. Cl. ........................ 359/366; 359/729; 359/731
(58) Field of Search ................................ 359/363–366, 359/727–731, 856–861, 350–361, 399, 222–231; 355/52–68; 250/492.2; 378/34

(56) References Cited

U.S. PATENT DOCUMENTS 5,153,898 A 10/1992 Suzuki et al. ................. 378/34
5,686,728 A 11/1997 Shafer ..................... 250/492.2
5,815,310 A 9/1998 Williamson ................. 359/365
6,033,079 A 3/2000 Hudyma ..................... 359/857
6,109,756 A * 8/2000 Takahashi ................... 359/857
6,172,825 B1 * 1/2001 Takahashi ................... 359/859
6,198,793 B1 3/2001 Schultz et al. ................ 378/34
6,199,991 B1 3/2001 Braat ......................... 359/856

FOREIGN PATENT DOCUMENTS

EP 0252734 A2 1/1988
EP 0779528 A2 6/1997
EP 0947882 A2 10/1999
EP 0955641 A1 11/1999
EP 1035445 9/2000
JP 2000-100694 * 4/2000 ................ 359/857
WO WO99/57606 11/1999

* cited by examiner

*Primary Examiner*—Thong Q Nguyen
(74) *Attorney, Agent, or Firm*—Ohlandt, Greeley, Ruggiero & Perle, LLP

(57) ABSTRACT

There is provided a microlithography projection objective for short wavelengths, with an entrance pupil and an exit pupil for imaging an object field in an image field, which represents a segment of a ring field, in which the segment has an axis of symmetry and an extension perpendicular to the axis of symmetry and the extension is at least 20 mm. The objective comprises a first (S1), a second (S2), a third (S3), a fourth (S4), a fifth (S5) and a sixth mirror (S6) in centered arrangement relative to an optical axis. Each of these mirrors have an off-axis segment, in which the light beams traveling through the projection objective impinge. The diameter of the off-axis segment of the first, second, third, fourth, fifth and sixth mirrors as a function of the numerical aperture NA of the objective at the exit pupil is ≦1200 mm * NA.

23 Claims, 16 Drawing Sheets

Table 1

| Element Number | Radius | Thickness | Diameter | Type |
|---|---|---|---|---|
| Object | INF | 743.3276 | | |
| 1 | A(1) | -557.1863 | 210.8986 | REFL |
| | | aperture diaphragm | 177.1640 | |
| | | 0.0000 | | |
| 2 | A(2) | 702.9968 | 177.3847 | REFL |
| 3 | A(3) | -221.1310 | 191.0743 | REFL |
| 4 | A(4) | 787.9929 | 426.0706 | REFL |
| 5 | A(5) | -436.7697 | 110.1796 | REFL |
| 6 | A(6) | 480.7697 | 310.6813 | REFL |
| Image | INF | | 70.5007 | |

asperic constants $$Z = \frac{(CURV)\,Y^2}{1 + (1 - (1 + K)\,(CURV)^2\,Y^2)^{1/2}} + (A)\,Y^4 + (B)\,Y^6 + (C)\,Y^8 + (D)\,Y^{10} + (E)\,Y^{12} + (F)\,Y^{14} + (G)\,Y^{16} + (H)\,Y^{18} + (J)\,Y^{20}$$

| asperic profile | CURV | K<br>E | A<br>F | B<br>G | C<br>H | D<br>J |
|---|---|---|---|---|---|---|
| A(1) | 0.00006144 | 0.000000<br>1.87256E-29 | 5.4896E-10<br>0.00000E+00 | -4.47710E-15<br>0.00000E+00 | 6.93597E-20<br>0.00000E+00 | -1.61832E-24<br>0.00000E+00 |
| A(2) | 0.00092955 | 0.000000<br>-7.88639E-30 | -4.50667E-11<br>0.00000E+00 | -3.63055E-16<br>0.00000E+00 | -3.52050E-21<br>0.00000E+00 | 7.46570E-26<br>0.00000E+00 |
| A(3) | 0.00284106 | 0.000000<br>1.64447E-27 | -3.98337E-10<br>0.00000E+00 | -2.92857E-15<br>0.00000E+00 | 8.46286E-19<br>0.00000E+00 | -5.98614E-23<br>0.00000E+00 |
| A(4) | 0.00193867 | 0.000000<br>-1.71616E-31 | -3.55491E-12<br>0.00000E+00 | 7.43877E-17<br>0.00000E+00 | -5.36969E-22<br>0.00000E+00 | 2.36533E-26<br>0.00000E+00 |
| A(5) | 0.00179551 | 0.000000<br>-9.96256E-26 | 5.44569E-09<br>0.00000E+00 | 1.45719E-13<br>0.00000E+00 | -5.07132E-18<br>0.00000E+00 | 1.13331E-21<br>0.00000E+00 |
| A(6) | 0.00186905 | 0.000000<br>4.44608E-32 | 6.69863E-11<br>0.00000E+00 | 3.06114E-16<br>0.00000E+00 | 1.29123E-21<br>0.00000E+00 | 2.82784E-27<br>0.00000E+00 |

Fig. 11

Reference wavelength = 13.4 nm
Imaging scale [reduction ratio] = 0.25
Image-side aperture = 0.25

Table 2

| Element Number | Radius | Thickness | Diameter | Type |
|---|---|---|---|---|
| Object | INF | 763.1539 | | |
| 1 | A(1) | -508.8959 | 217.5892 | REFL |
| | | aperture diaphragm | 157.2988 | |
| | | 0.0000 | | |
| 2 | A(2) | 592.9977 | 157.6458 | REFL |
| 3 | A(3) | -263.0251 | 186.9465 | REFL |
| 4 | A(4) | 857.5155 | 464.9979 | REFL |
| 5 | A(5) | -437.1855 | 110.6968 | REFL |
| 6 | A(6) | 481.2681 | 311.8894 | REFL |
| Image | INF | | 70.8868 | |

asperic constants $$Z = \frac{(CURV)\,Y^2}{1 + (1 - (1+K)\,(CURV)^2\,Y^2)^{1/2}} + (A)\,Y^4 + (B)\,Y^6 + (C)\,Y^8 + (D)\,Y^{10} + (E)\,Y^{12} + (F)\,Y^{14} + (G)\,Y^{16} + (H)\,Y^{18} + (J)\,Y^{20}$$

| asperic profile | CURV | K<br>E | A<br>F | B<br>G | C<br>H | D<br>J |
|---|---|---|---|---|---|---|
| A(1) | 0.00009342 | 0.000000<br>3.09845E-29 | 5.02048E-10<br>0.00000E+00 | -3.59798E-15<br>0.00000E+00 | 4.65491E-20<br>0.00000E+00 | -1.24487E-24<br>0.00000E+00 |
| A(2) | 0.00094495 | -0.000000<br>0.00000e+00 | -8.64008E-11<br>0.00000E+00 | -8.21885E-16<br>0.00000E+00 | -7.41356E-21<br>0.00000E+00 | -3.30260E-25<br>0.00000E+00 |
| A(3) | 0.00281349 | 0.000000<br>-3.93860E-27 | -8.95729E-10<br>0.00000E+00 | 1.08088E-14<br>0.00000E+00 | -1.55198E-18<br>0.00000E+00 | 1.20451E-22<br>0.00000E+00 |
| A(4) | 0.00176899 | 0.799352<br>-1.67295E-30 | -6.05769E-10<br>0.00000E+00 | -1.14820E-15<br>0.00000E+00 | -3.64542E-20<br>0.00000E+00 | 2.50132E-25<br>0.00000E+00 |
| A(5) | 0.00182078 | 0.000000<br>-8.77929E-26 | 5.28849E-09<br>0.00000E+00 | 1.32507E-13<br>0.00000E+00 | -2.78314E-18<br>0.00000E+00 | 7.00685E-22<br>0.00000E+00 |
| A(6) | 0.00186581 | 0.000000<br>5.80814E-32 | 6.68738E-11<br>0.00000E+00 | 3.06141E-16<br>0.00000E+00 | 1.34385E-21<br>0.00000E+00 | 1.39691E-27<br>0.00000E+00 |

Reference wavelength = 13.4 nm
Imaging scale [reduction ratio] = 0.25
Image-side aperture = 0.25

Fig. 12

Table 3

| Element Number | Radius | Thickness | Diameter | Type |
|---|---|---|---|---|
| Object | INF | 767.2557 | | |
| 1 | A(1) | -555.7033 | 216.0671 | REFL |
| | | aperture diaphragm | 173.9832 | |
| | | 0.0000 | | |
| 2 | A(2) | 682.2766 | 174.2476 | REFL |
| 3 | A(3) | -233.6859 | 188.2262 | REFL |
| 4 | A(4) | 794.6148 | 428.4537 | REFL |
| 5 | A(5) | -436.8293 | 110.5239 | REFL |
| 6 | A(6) | 480.8400 | 310.5587 | REFL |
| Image | INF | | 70.4765 | |

asperic constants $$Z = \frac{(CURV)\,Y^2}{1 + (1 - (1 + K)(CURV)^2\,Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asperic profile | CURV | K<br>E | A<br>F | B<br>G | C<br>H | D<br>J |
|---|---|---|---|---|---|---|
| A(1) | 0.00000000 | 0.000000<br>2.03931E-29 | 5.67634E-10<br>0.00000E+00 | -4.28505E-15<br>0.00000E+00 | 6.16577E-20<br>0.00000E+00 | -1.42715E-24<br>0.00000E+00 |
| A(2) | 0.00092352 | 0.000000<br>-7.88639E-30 | -4.50667E-11<br>0.00000E+00 | -3.63055E-16<br>0.00000E+00 | -3.52050E-21<br>0.00000E+00 | 7.46570E-26<br>0.00000E+00 |
| A(3) | 0.00277871 | 0.000000<br>1.08438E-27 | -3.26329E-10<br>0.00000E+00 | -7.02528E-16<br>0.00000E+00 | 5.33788E-19<br>0.00000E+00 | -3.92007E-23<br>0.00000E+00 |
| A(4) | 0.00188296 | 0.000000<br>-6.94542E-31 | -9.51406E-12<br>0.00000E+00 | 5.06179E-16<br>0.00000E+00 | -9.93523E-21<br>0.00000E+00 | 1.33054E-25<br>0.00000E+00 |
| A(5) | 0.00185628 | 0.000000<br>-1.05073E-25 | 5.15785E-09<br>0.00000E+00 | 1.54832E-13<br>0.00000E+00 | -5.20812E-18<br>0.00000E+00 | 1.16863E-21<br>0.00000E+00 |
| A(6) | 0.00186897 | 0.000000<br>6.23447E-32 | 6.62264E-11<br>0.00000E+00 | 2.99098E-16<br>0.00000E+00 | 1.29774E-21<br>0.00000E+00 | 1.07497E-27<br>0.00000E+00 |

Reference wavelength = 13.4 nm
Imaging scale [reduction ratio] = 0.25
Image-side aperture = 0.25

Fig. 13

Table 4

| Element Number | Radius | Thickness | Diameter | Type |
|---|---|---|---|---|
| Object | INF | 739.9848 | | |
| 1 | A(1) | -659.9848 | 188.6091 | REFL |
| | | aperture diaphragm | 219.3872 | |
| | | 0.0000 | | |
| 2 | A(2) | 709.9848 | 219.1277 | REFL |
| 3 | A(3) | -492.0904 | 179.7699 | REFL |
| 4 | 847.3874 CC | 1094.5501 | 577.4446 | REFL |
| 5 | A(4) | -412.2537 | 109.4460 | REFL |
| 6 | A(5) | 452.2537 | 273.6442 | REFL |
| Image | INF | | 71.0012 | |

asperic constants $$Z = \frac{(CURV)\,Y^2}{1 + (1 - (1 + K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| asperic profile | CURV | K<br>E | A<br>F | B<br>G | C<br>H | D<br>J |
|---|---|---|---|---|---|---|
| A(1) | 0.00046523 | 0.000000<br>-3.23697E-28 | -7.36323E-11<br>0.00000E+00 | 1.86189E-15<br>0.00000E+00 | -7.73130E-20<br>0.00000E+00 | 8.54337E-24<br>0.00000E+00 |
| A(2) | 0.00092527 | -0.000000<br>0.00000E+00 | -5.11521E-11<br>0.00000E+00 | -3.80687E-16<br>0.00000E+00 | -3.05582E-21<br>0.00000E+00 | -7.83597E-27<br>0.00000E+00 |
| A(3) | 0.00241893 | 0.000301<br>7.76365E-28 | 5.01337E-10<br>0.00000E+00 | 2.76322E-15<br>0.00000E+00 | 1.65053E-19<br>0.00000E+00 | -1.79843E-23<br>0.00000E+00 |
| A(4) | 0.00112101 | 0.000000<br>2.29050E-25 | 6.42053E-09<br>0.00000E+00 | 6.30201E-15<br>0.00000E+00 | 6.16162E-18<br>0.00000E+00 | -2.15921E-21<br>0.00000E+00 |
| A(5) | 0.00192607 | 0.000000<br>0.00000E+00 | 1.40503E-10<br>0.00000E+00 | 8.32770E-16<br>0.00000E+00 | 3.64734E-21<br>0.00000E+00 | 5.66305E-26<br>0.00000E+00 |

Reference wavelength = 13.4 nm
Imaging scale [reduction ratio] = 0.25
Image-side aperture = 0.23

Fig. 14

6-MIRROR MICROLITHOGRAPHY PROJECTION OBJECTIVE

The present application is a continuation-in-part of U.S. patent application Ser. No. 09/503,640, filed Feb. 14, 2000, now U.S. Pat. No. 6,353,470. The present application also claims priorities of (a) German Patent Application No. 100 37 870.6, filed Aug. 1, 2000, (b) European Patent Application No. 01116916.6, filed Jul. 11, 2001, and (c) U.S. Provisional Patent Application No. 60/255,214, filed Dec. 13, 2000.

BACKGROUND OF THE INVENTION

1. Field of the Invention

The present invention relates to a microlithography objective and, more particularly, to a microlithography projection objective for short wavelengths, preferably ≦93 nm, a projection exposure system that includes such a microlithography projection objective, and a chip manufacturing process that employs such a projection exposure system.

Lithography with wavelengths<193 nm, particularly EUV lithography with $\lambda$=11 nm or $\lambda$=13 nm is discussed as a possible technique for imaging of structures<130 nm, most preferably <100 nm. The resolution of a lithographic system is described by the following equation:

$$RES=k_1 \cdot \lambda/NA,$$

wherein $k_1$ denotes a specific parameter of the lithography process, $\lambda$ denotes the wavelength of the incident light and NA is the numerical aperture of the system on the image side.

Reflective systems with multilayers are used as optical components for imaging systems in the EUV range. Preferably Mo/Be systems are used as multilayer systems at $\lambda$=11 nm and Mo/Si systems are used for $\lambda$=13 nm systems.

If a numerical aperture of 0.2 is used as a basis for calculation, then the imaging of 50-nm structures with 13-nm radiation requires a relatively simple process with $k_1$=0.77. With $k_1$=0.64, imaging of 35-nm structures is possible with 11-nm radiation.

Since the reflectivity of the multilayers used lies only in the range of approximately 70%, it is of importance to use as few optical components as possible in an EUV projection objective, in order to achieve a sufficient light intensity.

Systems with six mirrors have proven particularly preferred for NA=0.20 with a view toward a high light intensity and sufficient possibilities for correction of imaging errors.

2. Description of the Prior Art

6-Mirror systems for microlithography have been made known from the publications U.S. Pat. No. 5,153,898; EP-A-0 252,734; EP-A-0 947,882; U.S. Pat. No. 5,686,728; EP 0 779,528; U.S. Pat. No. 5,815,310; WO 99/57606; and U.S. Pat. No. 6,033,079.

The projection lithography system according to U.S. Pat. No. 5,686,728 shows a projection objective with six mirrors, wherein each of the reflective mirror surfaces is formed aspherically. The mirrors are arranged along a common optical axis such that an obscuration-free light path is obtained.

Since the projection objective known from U.S. Pat. No. 5,686,728 is used only for UV light with a wavelength of 100–300 nm, the mirrors of this projection objective have a very high aspheric departure of approximately ±50 $\mu$m as well as a very large angle of incidence of approximately 38° C. Also, after stopping down the aperture to NA=0.2, an aspheric departure of 25 $\mu$m from peak to peak remains here along with a barely reduced angle of incidence. Such aspheric departures and angles of incidence are not practical in the EUV range due to the high requirements for surface quality and reflectivity of the mirror.

Another disadvantage of the objective that was made known from U.S. Pat. No. 5,686,728 does not permit a use in the wavelength range of $\lambda$<100 nm, particularly at wavelengths of 11 and 13 nm, is the very short distance between the wafer and the mirror arranged next to the wafer. In the case of the distances between the wafer and the mirror next to the wafer, known from U.S. Pat. No. 5,686,728, the mirrors can only be made very thin. Due to the extreme layer stresses in multilayer systems for the discussed wavelengths of 11 and 13 nm, such mirrors are very unstable.

A projection objective with six mirrors for application in EUV lithography, particularly also for wavelength of 13 nm and 11 nm, has been made known from EP-A-0 779,528.

This projection objective also has the disadvantage that at least two of the total of six mirrors have very high aspheric departures of 26 or 18.5 $\mu$m. However, even in the arrangement known from EP-A-0 779,528, the optical free working distance between the mirror next to the wafer and the wafer itself is so small that the mirror next to the wafer has instabilities or a mechanical free working distance that is negative.

A 6-mirror projection objective for EUV lithography with a mirror sequence of concave-concave-convex-concave-convex-concave is shown in WO 99/57606. This objective has a numerical aperture at the object of $NA_{object}$=0.2. All mirrors of the system known from WO 99/57606 are made aspherical.

It is a disadvantage of the 6-mirror objective known from WO 99/57606 that there is no easy accessibility to the off-axis segments, for example, for mounting, particularly the second and third mirrors. In addition, the off-axis segment of the fourth mirror is arranged far outside the optical axis in the case of the system known from WO 99/57606. This leads to problems with respect to the stability of the mirror systems and in the manufacture of this mirror segment. Also, a large space is necessary in order to encapsulate the system. Since the system is utilized in vacuum, a relatively large space has then to be evacuated. The diaphragm arranged between the second and third mirrors according to WO 99/557606 has large angles of incidence on the third mirror as a consequence, which are particularly greater than 18°.

A 6-mirror system is known from U.S. 6,033,079, in which the angles of incidence on all mirrors are less than 18°. Of course, this system also has the disadvantage that the off-axis segment of the third mirror is not accessible and the off-axis segments of individual mirrors, for example, of the fourth mirror (M4), are so large that a large space to encapsulate the system is required, as in the case of the system known from WO 99/57606, which again leads to a relatively large space that must be evacuated. Another disadvantage of relatively large mirrors is their lack of stability and the fact that correspondingly large coating chambers and production equipment are required for their manufacture.

SUMMARY OF THE INVENTION

The object of the invention is thus to provide a projection objective suitable for lithography with short wavelengths, preferably less than 100 nm, which does not have the above-mentioned disadvantages of the state of the art; in particular, a projection objective should be provided, which is characterized by dimensions that are as small as possible, a good accessibility to the off-axis segment of each mirror, as well as an aperture that is as large as possible and possibilities for correction of imaging errors.

According to the invention, this object is solved by a microlithography projection objective for short wavelengths, preferably ≦193 nm, which comprises an entrance pupil and an exit pupil for imaging an object field in an image field, which represents the segment of a ring field, wherein the segment has an axis of symmetry and an extension perpendicular to the axis of symmetry and the extension is at least 20, but preferably 25 mm, as well as a first, a second, a third, a fourth, a fifth and a sixth mirror in a centered arrangement relative to an optical axis, wherein each of these mirrors has an off-axis segment, in which the light beams impinge, which have been guided through the projection objective, and the diameter of the off-axis segment of the first, second, third, fourth, fifth and sixth mirrors is ≦1200 mm*NA, preferably ≦300 mm, depending on the numerical aperture NA at the exit pupil, whereby the numerical aperture NA at the exit pupil of the objective according to the invention is greater than 0.1, preferably greater than 0.2, and most preferably greater than 0.23. In the present application, the numerical aperture at the exit pupil is understood to be the numerical aperture of the beam bundle impinging the image plane, the so-called image-side numerical aperture.

In the field of microlithography, it is advantageous if the imaging beam bundle impinges the image plane telecentrically. Advantageously, the sixth mirror S6 of the projection objective is then concavely shaped. The fifth mirror S5 lies between the sixth mirror S6 and the image plane.

If one wishes to produce a shadow-free beam path with such an objective, then the numerical aperture NA at the exit pupil is effected.

In an advantageous embodiment, a shadow-free beam path is produced in the objective by increasing the central radius of the ring field to be imaged along with an increase in the numerical aperture at the exit pupil.

A volume claim of a mirror in a projection objective is a structural space, typically on the rear side of the mirror, for a device such as a mounting, manipulator, etc. The accessibility of the individual mirrors of the objective, particularly for purposes of mounting the mirrors is assured in a preferred embodiment, if the first, second, third, fourth, fifth and sixth mirrors each have a volume claim on the rear side of the mirrors, which has a depth along the optical axis measured from the front side of the off-axis segment of the mirror, wherein the depths of the first, second, third, fourth and sixth volume claims are at least 50 mm each, and the depth of the volume claim of the fifth mirror is greater than ⅓ the value of the diameter of the fifth mirror and the respective volume claims are not penetrated.

It is a particular advantage with respect to accessibility, if all of the volume claims can be extended in a direction parallel to the axis of symmetry, without intersecting the light path in the objective or the volume claim of another mirror.

A particularly stable system is obtained with respect to edge deformations induced by layer stress, if the edge region encircling the off-axis segments of all mirrors amounts to more than 4 mm, whereby the light is guided free of obscuration in the objective.

The coating of the mirror substrate with the previously mentioned Mo/Be or Mo/Si multilayer systems often produces stresses as a consequence, which can lead to deformations, particularly at the edge of the substrate. A sufficiently large edge region prevents these stresses from continuing into the off-axis segment of the mirror.

In a preferred embodiment, the off-axis segment of the fourth mirror lies geometrically between the second mirror and the image plane.

It is particularly preferred, if the fourth mirror is arranged geometrically between the third and second mirrors, particularly between the first and second mirrors. Such an arrangement has, as a consequence, particularly small dimensions of the off-axis segment of the first, second, third and fourth mirrors.

The distance of the mirror vertex along the optical axis from the fourth to the first mirror (S4 S1), relative to the distance of the second to the first mirror (S2 S1) advantageously lies in the range:

$$0.1<(S\mathbf{4}\ S\mathbf{1})|(S\mathbf{2}\ S\mathbf{1})<0.9$$

and the distance from the third to the fourth mirror (S3 S4) relative to the distance from the second to the third mirror (S2 S3) is preferably in the range:

$$0.3<(S\mathbf{2}\ S\mathbf{4})/(S\mathbf{2}\ S\mathbf{3})<0.9.$$

In order to obtain a shadow-free beam path, there are two particularly critical regions in the objective part comprising the fifth and the sixth mirrors.

One of these regions lies at the upper edge of the fifth mirror. The beam must be guided in such a way that the rays at the lower edge run above the off-axis segment of this mirror and impinge the image plane. The other critical region lies at the lower edge of the sixth mirror.

A shadow-free beam path is obtained in paraxial approximation in the above-named regions at the fifth and sixth mirrors, if the central radius of the ring field is selected as follows:

$$R \geq \tan(\text{arc } \sin(NA)) * \left[ (S5\ B) + (S5\ S6) - \frac{1}{\frac{2}{r_6} - \frac{1}{r_5 + (S5\ S6)}} \right]$$

as a function of the numerical aperture NA at the exit pupil, the distances of the mirror vertices from the fifth to the sixth mirror (S5 S6), the distance from the fifth mirror to the image plane (S6 B), and the radii of curvature $r_5$, $r_6$ of the fifth and sixth mirrors. If the minimum radius is not reached while maintaining the condition of an obscuration-free beam path, there is an abrupt increase of aspheric deviation from the basic spherical form of the mirror, which is also denoted the aspheric departure of the mirror. This particularly applies to the fifth mirror. The region for which the paraxial approximation and the above-named formula is valid is thus abandoned. Mirrors with high aspheric departures, however, can be manufactured only with high expenditure for technical production.

In order to minimize the angles under which the rays of a ray bundle impinges the mirrors, advantageously the angle of incidence of the chief ray of the field point, which lies in the center of the object field on the axis of symmetry, is <18° on all mirrors.

In a particular form of embodiment of the invention, the projection objective has an intermediate image, whereby the intermediate image is advantageously formed in the projection objective in the direction of light after the fourth mirror.

In a first configuration of the invention, the first mirror is formed convex and all six mirrors are made aspheric.

In another configuration of the invention, the first mirror is concave and all six mirrors are made aspheric.

Alternatively to this, the first mirror can have a zero based curvature and all six mirrors are made aspheric.

In another configuration, the second mirror (S2) to the sixth mirror (S6) are configured in the sequence: concave-convex-concave-convex-concave.

Such an embodiment is particularly preferred if the mirror with the off-axis segment having the greatest distance from the optical axis, which is usually the off-axis segment of the fourth mirror, is spherical.

In addition to the projection objective, the invention also makes available a projection exposure system, wherein the projection exposure system includes an illumination device for illuminating a ring field as well as a projection objective according to the invention.

BRIEF DESCRIPTION OF THE DRAWINGS

The invention will be described herein further on the basis of the examples shown in the figures: The figures show:

FIG. 11: Table 1 showing the Code V data of the embodiment of FIG. 4.

FIG. 12: Table 2 showing the Code V data of the embodiment of FIG. 5.

FIG. 13: Table 3 showing the Code V data of the embodiment of FIG. 7.

FIG. 14: Table 4 showing the Code V data of the embodiment of FIG. 8.

DESCRIPTION OF THE INVENTION

Figure 1:
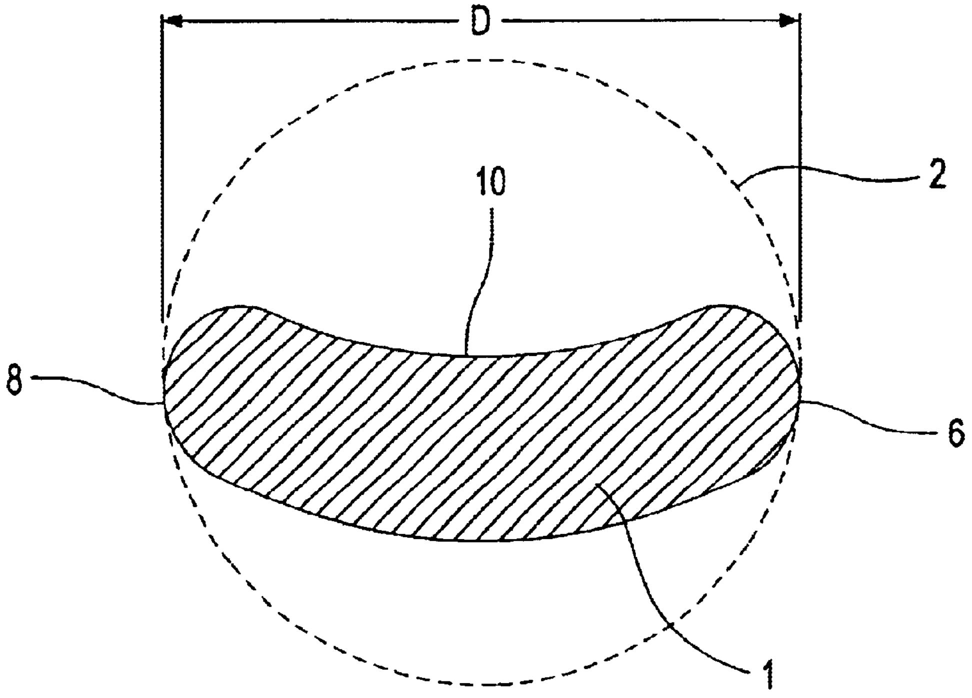
FIG. 1: the shape of an off-axis segment of a mirror.

In FIG. 1 is shown what is to be understood in the present application as the off-axis segments of a mirror and the diameter of such an off-axis segment.

FIG. 1 shows a kidney-shaped field as an example of a projected field 1 on a mirror of the projection objective. Such a shape is expected for the off-axis segments in an objective according to the invention, if used in a microlithography projection exposure system. The enveloping circle 2 completely encloses the kidney shape and coincides with edge 10 of the kidney shape at two points 6, 8. The enveloping circle is always the smallest circle that encloses the off-axis segment. Diameter D of the off-axis segment then results from the diameter of enveloping circle 2.

Figure 2:
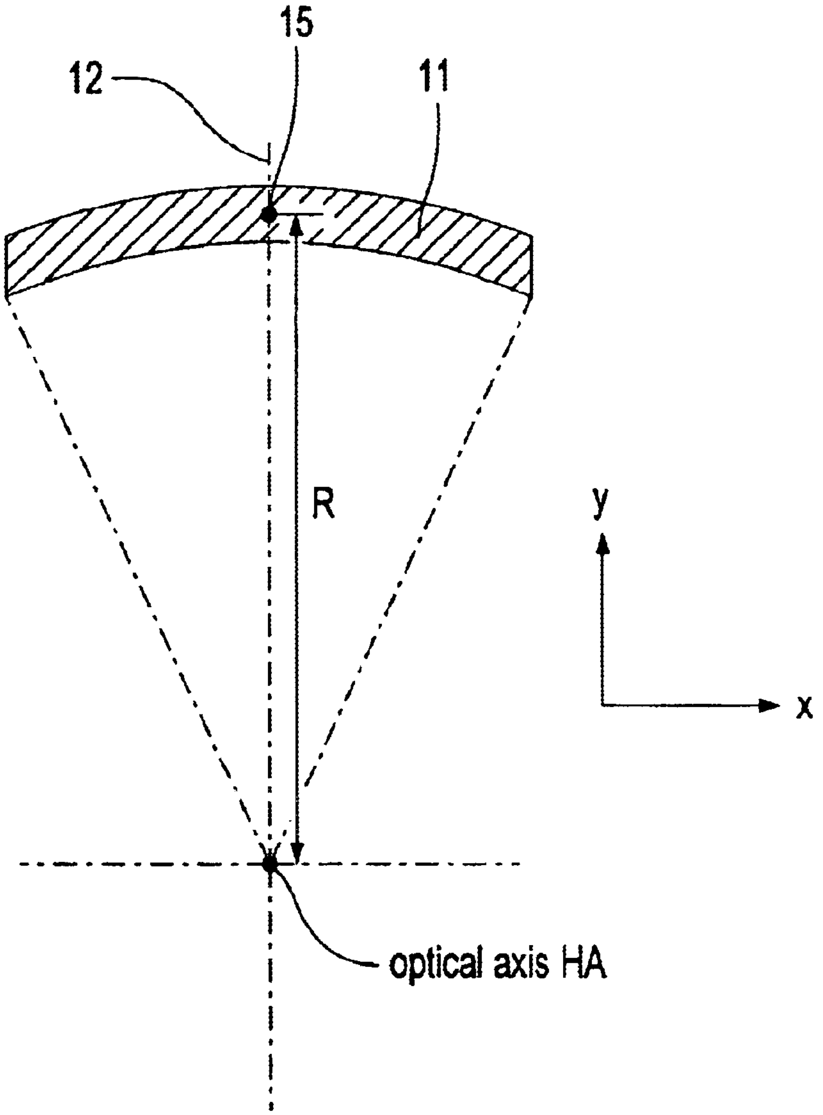
FIG. 2: the ring field in the object plane of the objective.

In FIG. 2, the object field 11 of a projection exposure system is shown in the object plane of the projection objective, which is imaged by means of the projection objective according to the invention in an image plane, in which a light-sensitive object, for example, a wafer is arranged. The image field in the image plane has the same shape as the object field. The object or image field 11 has the configuration of a segment of a ring field. The segment has an axis of symmetry 12.

In addition, the axes extending the object plane, i.e., the x-axis and the y-axis are depicted. As can be seen from FIG. 2, the axis of symmetry 12 of ring field 11 runs in the direction of the y-axis. At the same time, the y-axis coincides with the scanning direction of an EUV projection exposure system, which is designed as a ring field scanner. The x-direction is thus the direction that stands perpendicular to the scanning direction, within the object plane. The ring field has a so-called central ring-field radius R, which is defined by the distance of central point 15 of the image field from the optical axis HA of the projection objective.

Figure 3:
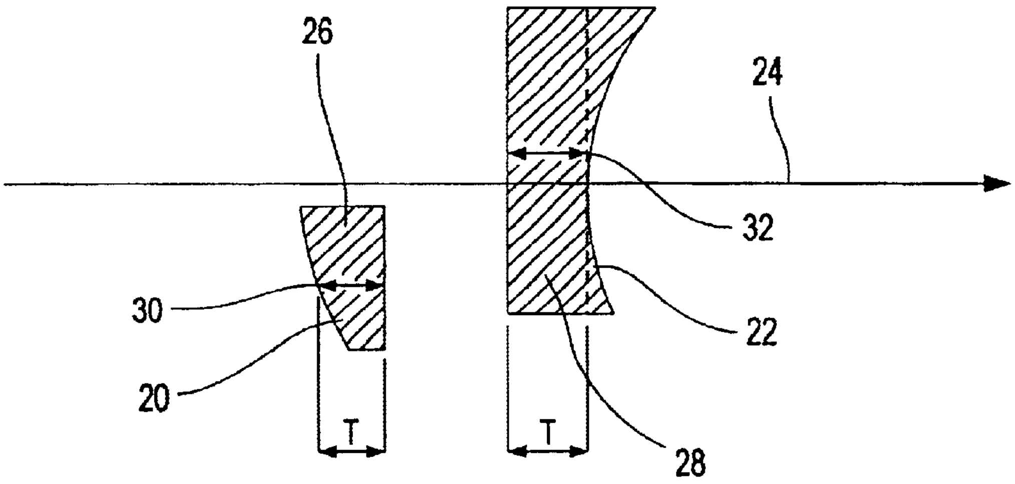
FIG. 3: the definition of the volume claim of a mirror in an example comprising two mirrors of the projection objective.

For example, for the total system, two mirror segments 20, 22 of a projection objective according to the invention are shown in FIG. 3, wherein mirror segments 20, 22 correspond to the off-axis segments of the mirrors. The mirror segments are arranged along an optical axis 24.

As can be further seen from FIG. 3, a volume claim 26, 28 is assigned to each off-axis segment 20, 22 of a mirror of the projection objective. Depth T of the volume claim of each mirror in the present application is understood to be the extension of the volume claim from central point 30, 32 of the off-axis segment 20, 22 of each mirror parallel to the optical axis. In the present application, the point of incidence of the chief ray CR of the central field point of the object field on the off-axis segment of the respective mirror is to be understood as the central point of the off-axis segment. As is shown in FIG. 3, the mirrors are arranged in the projection objective in such a way that the volume claims 26, 28 are not penetrated geometrically.

Figure 4:
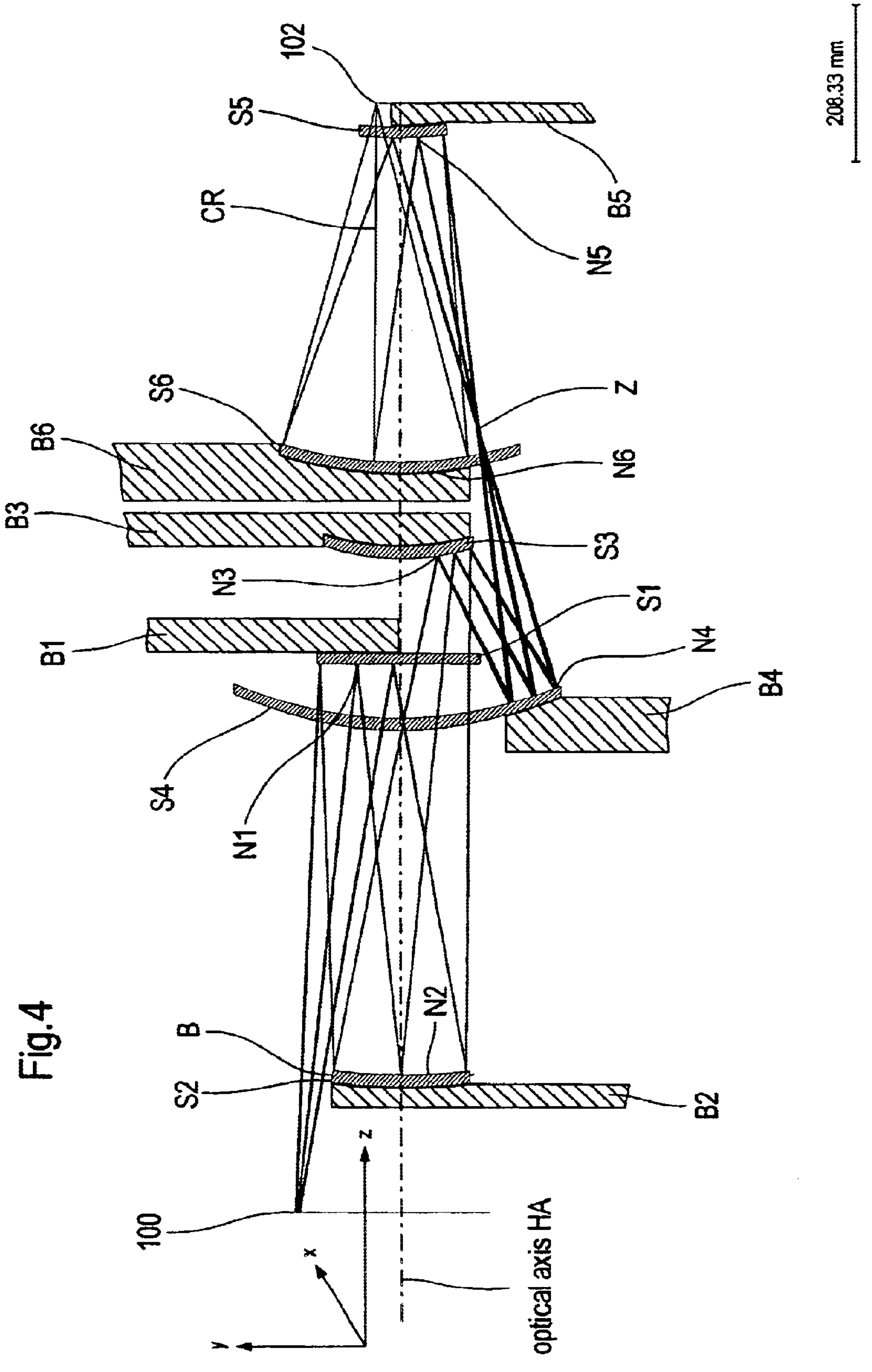
FIG. 4: a first embodiment of a projection objective according to the invention with six aspheric mirrors, wherein the first mirror is convex.

A first example of embodiment of a 6-mirror system according to the invention is shown in FIG. 4, wherein the size of the object to be imaged, which represents the segment of a ring field and has an axis of symmetry as shown in FIG. 2, is at least 20 and preferably 25 mm, in the direction perpendicular to the axis of symmetry. The object to be imaged is arranged in the object plane 100 of the objective shown in FIG. 4. A ring field segment is formed in object plane 100 as the object field in the present example. In addition, the object to be imaged onto a light-sensitive layer is arranged in the object plane. This object is denoted also as a reticle in microlithography.

The object in the object plane 100 is imaged by the projection objective according to the invention, is the image plane 102, in which, for example, a wafer can be arranged. The projection objective according to the invention includes a first mirror S1, a second mirror S2, a third mirror S3, a fourth mirror S4, a fifth mirror S5 as well as a sixth mirror S6. In the example of embodiment shown in FIG. 4, all six mirrors S1, S2, S3, S4, S5, and S6 are formed as aspheric mirrors. In the case of the first mirror S1, this involves a convex mirror.

Diaphragm B is arranged on the second mirror S2 in the first example of embodiment according to FIG. 4. The system is centered relative to the optical axis HA and is telecentric on the image side, i.e., in image plane 102. Image-side telecentry is to be understood such that the chief ray CR impinges the image plane 102 at an angle of close to or approximately 90°.

Within the mirror system, in order to keep light losses and wavefront aberrations as small as possible, which are induced by the coating, the incidence angle of the chief ray CR of the central field point on the respective mirror surface is always smaller than 18°. The volume claims B1, B2, B3, B4, B5 and B6 of off-axis segments N1, N2, N3, N4, N5 and N6 of the respective mirrors S1, S2, S3, S4, S5 and S6 are also depicted in FIG. 4.

As can be clearly seen from FIG. 4, the total objective is constructed in such a way that all volume claims B1, B2, B3, B4, B5 and B6 can be extended in a direction parallel to the axis of symmetry 12 of the object field lying in object plane 100, without intersecting the light path in the objective or the volume claim of another mirror. In order to facilitate readability, a coordinate system x, y, z is depicted in FIG. 4. The optical axis of the objective runs in the z-direction, the object field lies in the x-y object plane and the axis of symmetry 12 of the object field in the object plane 100 points in the y-direction.

As can be seen from FIG. 4, the volume claims of all off-axis segments can be extended in the direction of the axis of symmetry 12 of the object field. This assures that the mirrors are accessible from at least one side of the objective and can be mounted, for example, and assembled.

In addition, the example of embodiment 1 according to FIG. 4 involves a system with intermediate image Z. The intermediate image Z is formed geometrically after the first mirror S1 between the fourth and fifth mirrors S4, S5. The system according to FIG. 4 is divided into two subsystems by intermediate image Z: a first subsystem comprising mirrors S1, S2, S3, and S4, as well as a second subsystem comprising mirrors S5 and S6.

The volume claims B1 to B4 and B6 of mirrors S1 to S4 and S6 amount to at least 50 mm, and the volume claim B5 of the fifth mirror amounts to at least one-third of the diameter of the volume claim of the fifth mirror, so that a free working distance between the fifth mirror S5 next to the wafer and image plane 102 of at least 12 mm is guaranteed.

The Code V data of the first embodiment according to FIG. 4 are shown in Table 1 in FIG. 11. Here the element numbers 1, 2, 3, 4, 5, 6 designate mirrors S1, S2, S3, S4, S5 and S6.

The numerical aperture of the system on the image side according to example of embodiment 1 amounts to 0.25.

Figure 5:
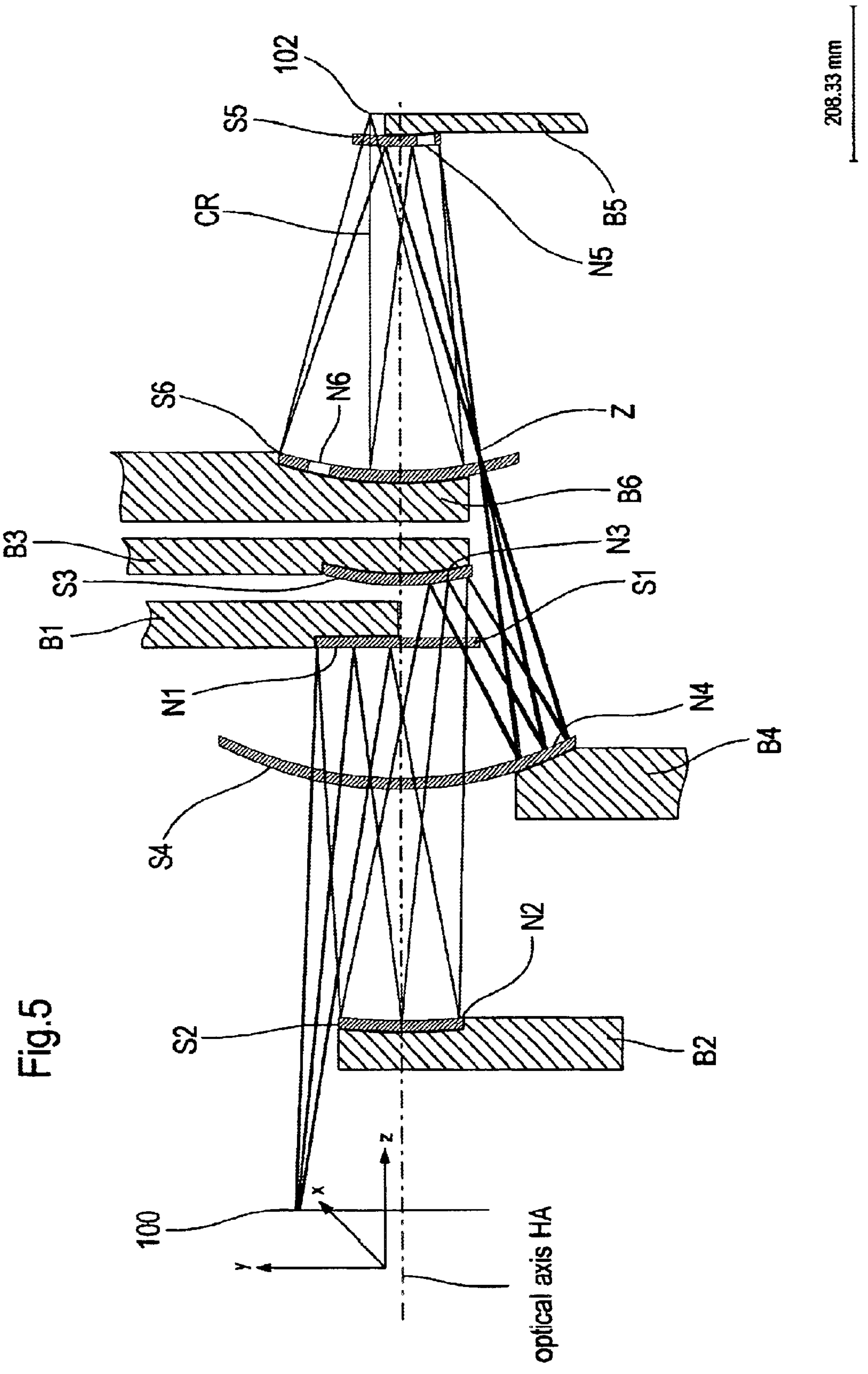
FIG. 5: a second embodiment of a projection objective according to the invention with six aspheric mirrors, wherein the first mirror is concave.

A second embodiment of the invention is shown in FIG. 5. The components that are the same as in FIG. 4 are given the same reference numbers. Again, all six mirror surfaces are aspheric, but in contrast to the embodiment according to FIG. 4, the first mirror S1 is not convex, but rather concave.

The Code V data of the system are shown in Table 2 in FIG. 12. The numerical aperture of the projection objective according to FIG. 5 amounts to NA=0.25, as in the case of the first form of embodiment according to FIG. 4.

In the example of embodiment according to FIG. 5, according to the invention, the diameter D of the off-axis segments of all mirrors arranged in the objective are less than 300 mm, whereby the object to be imaged is the segment of a ring field, as shown in FIG. 2.

The off-axis segment in the x-y plane of the respective mirror of the second example of embodiment according to FIG. 5 is shown in FIGS. 6*a* to 6*f*. The x-y coordinate system as defined by the object plane is denoted in all illustrations. Here, the y-direction denotes the direction in the direction of the scanning direction of a ring field scanner and the x-direction is the direction perpendicular to the scanning direction.

Figure 6A:
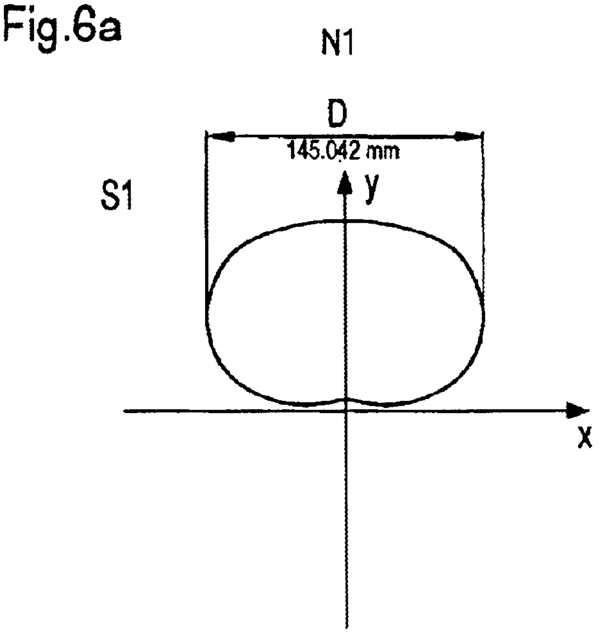
FIGS. 6*a*–6*f*: the off-axis segments of all six mirrors of a projection objective according to FIG. 4.
Figure 6B:
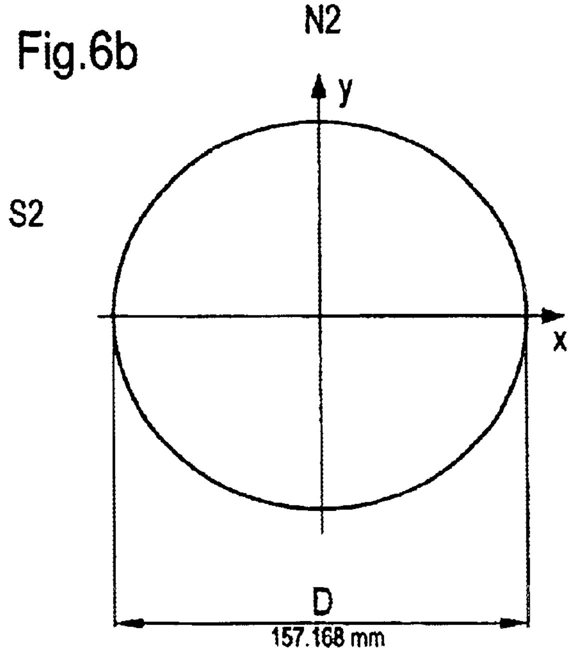

As can be seen from FIG. 6*a*, the off-axis segment N1 on mirror S1 is essentially kidney-shaped and has a diameter D, as defined in FIG. 1, of 145.042 mm. A diameter of off-axis segment N2 on mirror S2 is essentially circular, and the diameter amounts to 157.168 mm according to FIG. 6*b*.

Figure 6C:
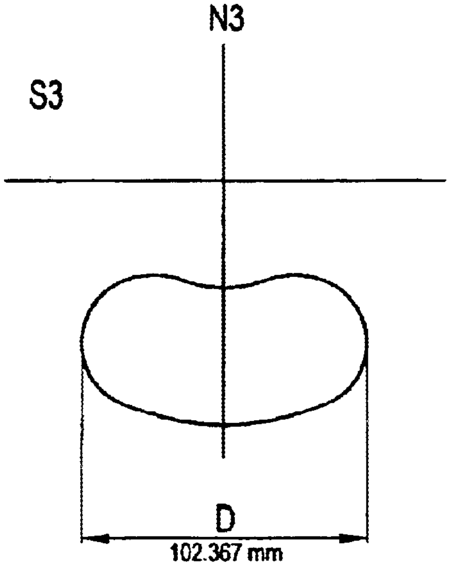
Figure 6D:
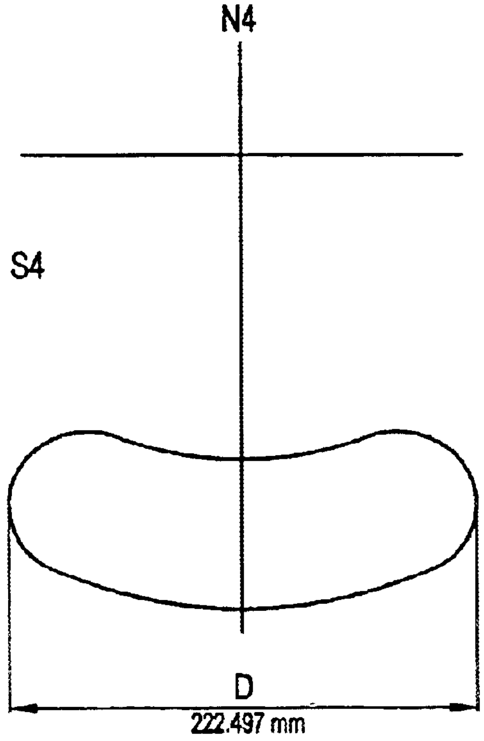

On mirror S3, the off-axis segment N3 is again kidney-shaped, diameter D amounts to 102.367 mm according to FIG. 6*c*, and in the case of mirror S4, the useable region N4 according to FIG. 6*d* has a diameter of 222.497 mm.

Figure 6E:
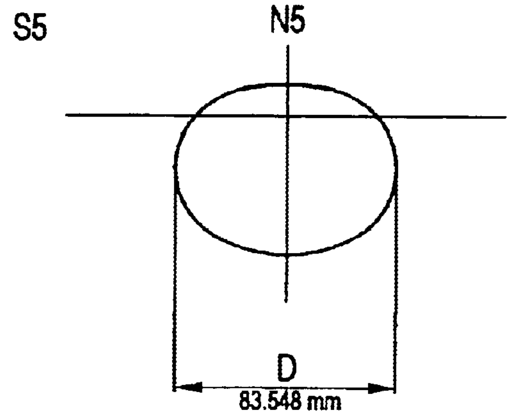
Figure 6F:
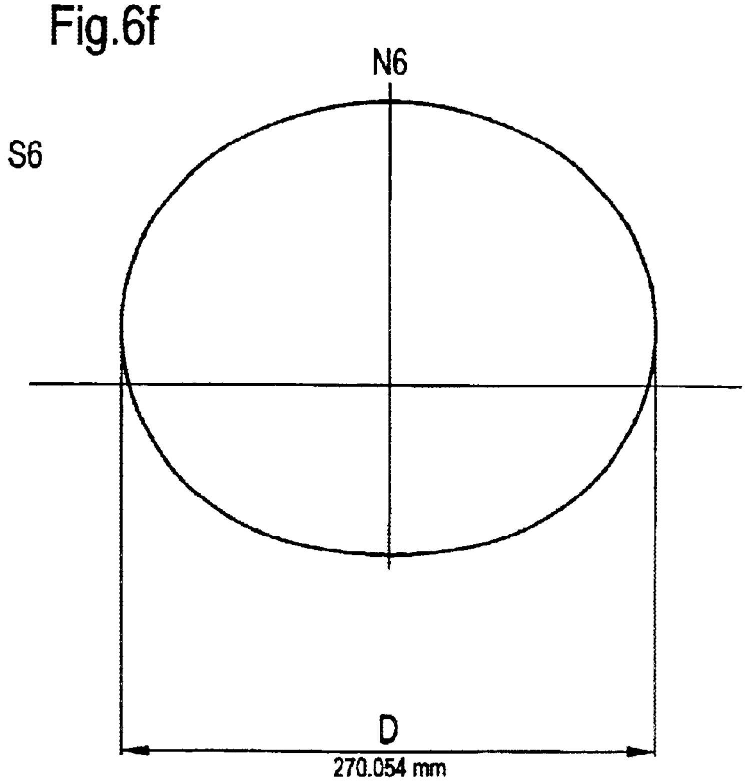

The off-axis segments N5 and N6 according to FIGS. 6*e* and 6*f* on mirrors S5 and S6 are essentially circular, and diameter D of useable region N5 amounts to 83.548 mm and diameter D of off-axis segment N6 is 270.054 mm.

The diameter of all off-axis segments N1 to N6 of the form of embodiment of the projection objective according to FIG. 5 is thus less than 300 mm.

Figure 7:
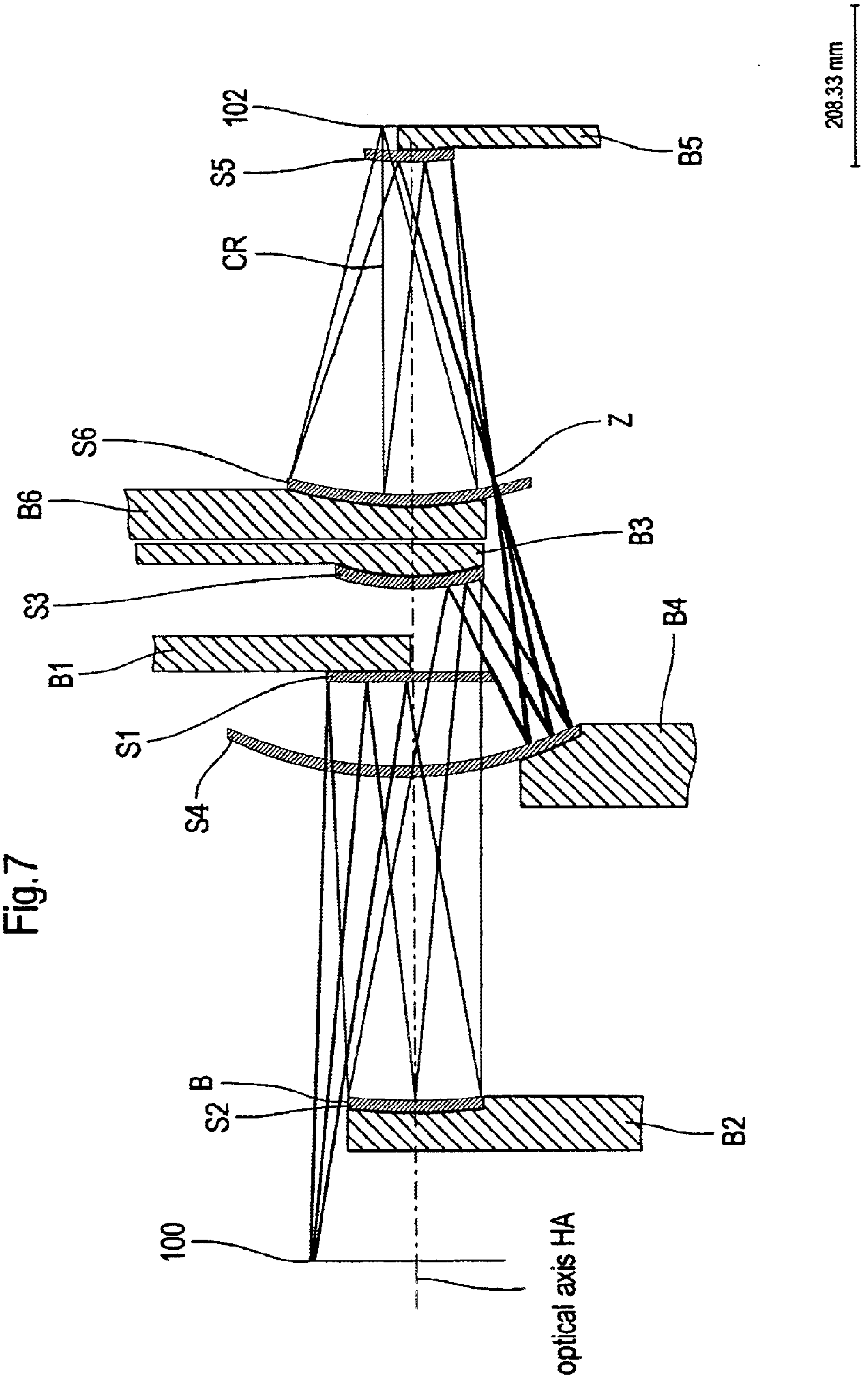
FIG. 7: a third embodiment of a projection objective according to the invention with six aspheric mirrors, wherein the first mirror is has zero base curvature.

A third form of embodiment of a projection objective according to the invention with six aspheric mirrors is shown in FIG. 7. Again, the same reference numbers as in FIGS. 4 and 5 are used for the same components. The data of the third form of embodiment according to FIG. 7 are indicated in Code V data in Table 3 in FIG. 13. The numerical aperture of the system according to FIG. 7 is NA=0.25. The first mirror S1 of the example of embodiment in FIG. 7 has a zero based curvature. It is understood by this in the present application that the basic curvature of mirror S1 in the vicinity of the optical axis HA is equal to null.

Figure 8:
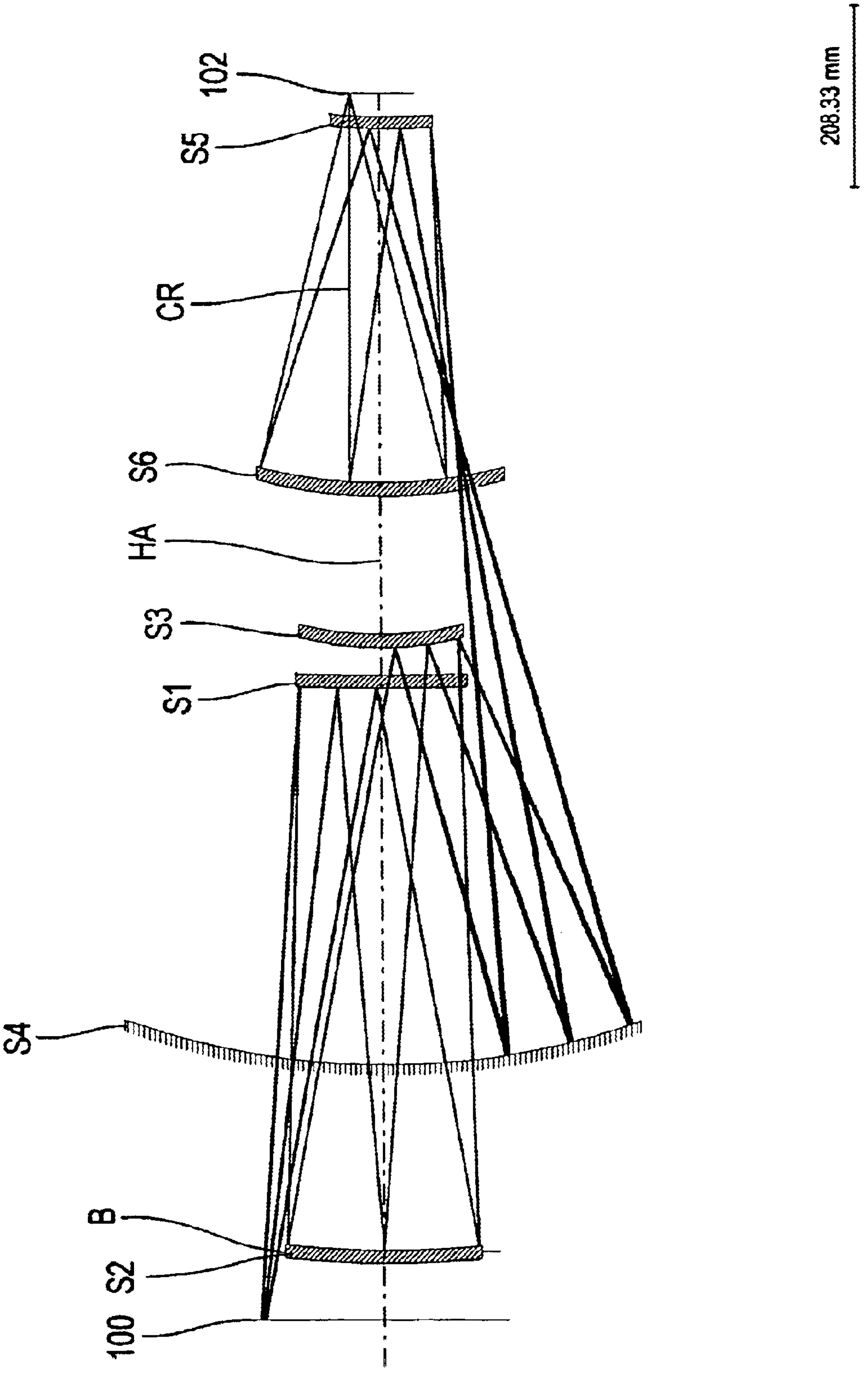
FIG. 8: a fourth embodiment of a projection objective according to the invention with five aspheric mirrors and one spherical mirror, wherein the fourth mirror is spherical.

A particularly advantageous 6-mirror system from the point of view of manufacturing is shown in FIG. 8. In the system according to FIG. 8, the numerical aperture is 0.23, the fourth mirror is a spherical mirror, which is very advantageous from the viewpoint of manufacturing, since spherical surfaces can be manufactured more easily than aspheric surfaces, and the fourth mirror S4 is the mirror with the off-axis segment with the greatest distance from the optical axis.

The data of the system according to FIG. 8 are given as Code V data in Table 4 in FIG. 14.

The position of the fourth mirror geometrically between the third and the second mirrors or the first and the second mirrors in the projection objective is responsible for the relatively small dimensions of the off-axis segments of the mirrors, particularly of the fourth mirror.

The data concerning the position of the fourth mirror with respect to the second and first mirrors or the second and third mirrors are described by the following conditions:

$$0.1<(S4, S1)/(S2, S1)<0.9 \qquad (1)$$

$$0.3<(S3, S4)/(S2, S3)<0.9 \qquad (2)$$

The following preferably applies for condition (2):

$$0.4<(S3, S4)/(S2, S3)<0.9 \qquad (2a)$$

These conditions are shown in the following Tables 5 and 6 for the four examples of embodiment.

TABLE 5

Data for condition (1)

| Embodiment | Property | (S4S1)/(S2S1) |
|---|---|---|
| 1 = FIG. 4 | M1 convex | 0.14 |
| 2 = FIG. 5 | M1 concave | 0.35 |
| 3 = FIG. 7 | M1 plane | 0.19 |
| 4 = FIG. 8 | NA = 0.23, 5 aspheric | 0.67 |

TABLE 6

Data for condition (2)

| Embodiment | Property | (S3S4)/(S2S3) |
|---|---|---|
| 1 = FIG. 4 | M1 convex | 0.31 |
| 2 = FIG. 5 | M1 concave | 0.44 |
| 3 = FIG. 7 | M1 plane | 0.34 |
| 4 = FIG. 8 | NA = 0.23, 5 aspheric | 0.69 |

The diameter of the off-axis segment is a particularly important parameter, since the diameters establish the dimensions of the objective chamber. Large off-axis segments and thus large mirrors require evacuation of a very large space, which is a disadvantage from the viewpoint of evacuating a large UHV system. Another disadvantage of large mirrors is their greater sensitivity relative to mechanical oscillations, since their natural frequency is smaller than in the case of smaller mirrors. Another advantage of mirrors with small dimensions lies in the fact that the steps of producing asphericity and coating the substrate can be conducted in small UHV processing chambers.

Since the coating of the mirror substrate with multilayer systems leads to layer stresses, deformations may occur, particularly at the edge of the substrate. In order that these should not propagate into the off-axis segment of the mirror, it is necessary to provide a minimum overrun outside the off-axis segment, within which the deformations can decay. The edge region of the individual mirrors in examples of embodiment 1 to 4 is shown in the following Table 7.

TABLE 7

Data for the edge regions of mirrors S1 to S6

| Mirror | A1 = FIG. 4 | A2 = FIG. 5 | A3 = FIG. 7 | A4 = FIG. 8 |
|---|---|---|---|---|
| S1 | 13 mm | 21 mm | 16 mm | 2 mm |
| S2 | 11 mm | 11 mm | 8 mm | 8 mm |
| S3 | 22 mm | 28 mm | 26 mm | 8 mm |
| S5 | 4 mm | 4 mm | 4 mm | 5 mm |
| S6 | 5 mm | 6 mm | 5 mm | 2 mm |

As can be seen from Table 7, the edge region in the embodiment according to FIGS. 4, 5 and 7 for each mirror amounts to more than 4 mm, which is especially advantageous for the technical consideration of layer stresses.

Figure 9:
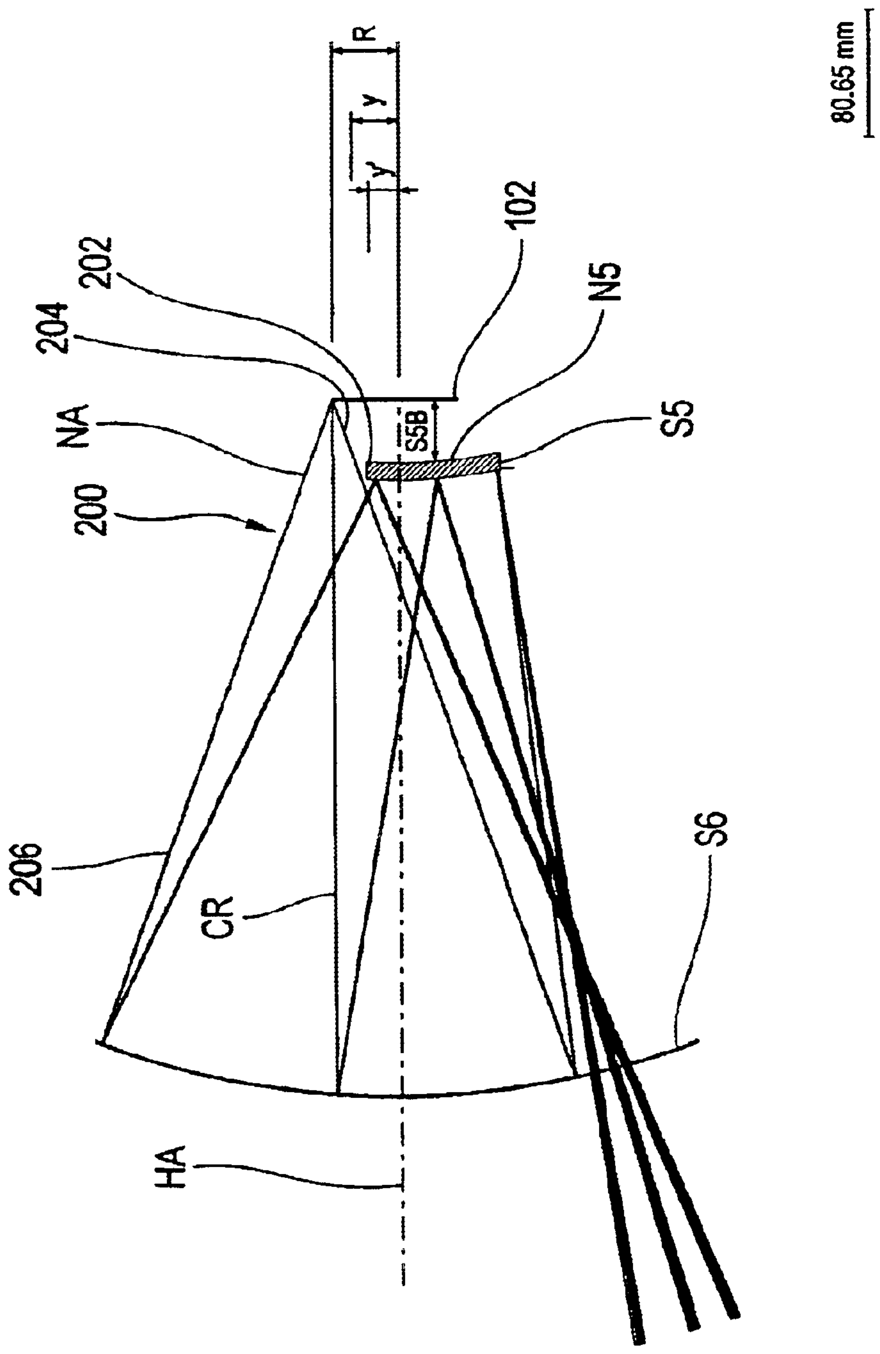
FIG. 9: region of the fifth and sixth mirrors of a six-mirror projection objective according to the invention.

The arrangement of fifth and sixth mirrors S5, S6 in an advantageous embodiment of a projection objective according to the invention is shown in FIG. 9.

According to FIG. 9, the imaging beam bundle 200 impinges the image plane 102, in which a wafer is arranged, for example, telecentrically. The sixth mirror S6 is concavely shaped. The fifth mirror S5 lies between the sixth mirror S6 and image plane 102. In projection objectives according to the invention, all mirrors S1, S2, S3, S4, S5, S6 are arranged between object plane 100 and image plane 102. If one requires a shadow-free beam path in the projection objective according to the invention, then there are existing two critical regions for guiding the beam in a shadow-free manner in the objective part comprising mirrors S5 and S6 on the image side, as shown in FIG. 9.

One of these critical regions lies at the upper edge 202 of the off-axis segment of the fifth mirror S5. The beams must be guided in such a way that the lower-edge rays 204 of beam bundle 200 run above off-axis segment N5 of mirror S5 and impinge on image plane 102. If R denotes the ring-field radius and (S5 B) the distance between S5 and image plane 102, then the distance of lower-edge rays 204 from the optical axis HA is given by the relation $$y = R - (S5\ B)^* \tan(\arcsin(NA)),$$

wherein NA denotes the numerical aperture at the exit pupil.

The upper limit of off-axis segment N5 is established by the point of impingement of upper-edge rays 206 of beam bundle 200 on the fifth mirror S5. By using the variables:
$r_6$: radius of curvature of S6
(S5 S6): (positive) distance between S5 and S6,
the application of the paraxial ray tracing formula to the sixth mirror S6 for the distance y' of upper edge 202 of the off-axis segment supplies N5 of the fifth mirror from the optical axis HA':

$$y' = \left[\frac{1}{\frac{2}{r_6} - \frac{1}{(S5\ B) + (S5\ S6) + \frac{R}{\tan(\arcsin(NA))}}} - (S5\ S6)\right]$$

$$\tan\left[\arcsin(NA) + 2\arcsin\left(\frac{NA}{r_6} * \left((S5\ B) + (S5\ S6) - r_6 + \frac{R}{\tan(\arcsin(NA))}\right)\right)\right]$$

In order to obtain an obscuration-free beam path at the fifth mirror S5, the following must then apply:

$$\Delta y = y - y' \geq 0$$

The other critical region lies at the lower edge of S6. In order to assure an obscuration-free light path in paraxial approximation at this mirror, the following results after applying the paraxial ray tracing formula twice to S5 and S6 for the ring-field radius R of the image field in the image plane 102:

$$R \geq \tan(\arcsin(NA)) * \left[(S5\ B) + (S5\ S6) - \frac{1}{\frac{2}{r_6} - \frac{1}{r_5 + (S5\ S6)}}\right]$$

If $r_6$, $r_5$, $(S_5 B)$ as well as $(S_5 S_6)$ are pregiven, e.g.,
$r_6$=535.215 mm; $r_5$=594.215 mm;
(S5 B)=44.083 mm; (S5 S6)=437.186 mm,
then the following Table 8 results from the above formula for the ring-field radius R as a function of the aperture under the boundary condition of an obscuration-free light path at the fifth mirror according to the formulas for y' and Δy given above:

TABLE 8

| NA | 0.15 | 0.20 | 0.25 | 0.30 |
|---|---|---|---|---|
| R in [mm] | 18.191 | 24.475 | 30.958 | 37.707 |

As can be recognized from Table 8, a large numerical aperture NA at the exit pupil has as a consequence a large ring-field radius.

In the case of the pregiven ring-field radius, an enlargement of the aperture is possible for coaxial 6-mirror objectives only up to a certain value. Above this value there is observed a nearly abrupt increase of the aspheric departure on the fifth mirror, which leads to problems in manufacturing the aspheric surface and also in measurement technology for measuring the aspheric surface, as well as problems in correcting the objective.

(S5 B) is equal to the so-called working distance of the objective at the wafer, which should not go below a minimum value. Therefore a reduction of the ring-field radius due to a reduction of (S5 B) is only possible until the minimum free working distance of the reduction objective is reached.

A reduction of the distance (S5 S6) in fact leads to smaller ring-field radii, but, on the other hand, increases the angle of incidence on the fifth mirror S5. To manufacture a multilayer system with such a large angle of incidence on S5 with optimal reflection capacity is very elaborate. A reduction of $r_5$ leads to the same disadvantages as the reduction in the distance (S5 S6), since such a reduction is also accompanied by large angles of incidence on S5.

An enlargement of $r_6$ in fact supplies smaller ring-field radii, but of course the freedom from obscuration at the fifth mirror is violated.

Figure 10:
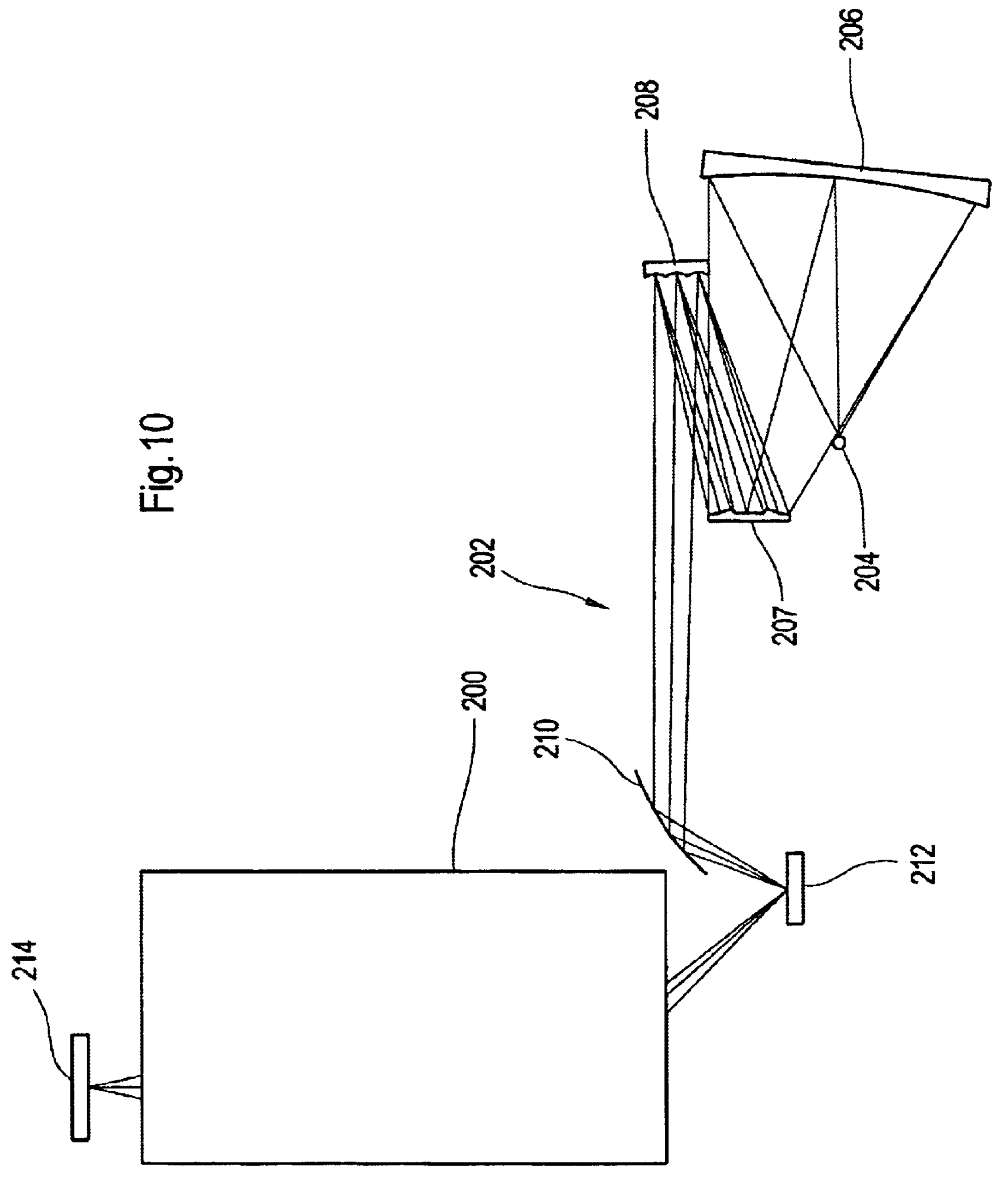
FIG. 10: a projection exposure system with an objective according to the invention.

A projection exposure device for microlithography with a 6-mirror projection objective 200 is shown in FIG. 10. The illumination system 202 can be formed as described, for example, in EP 99 106348.8 with the title "Illumination system, particularly for EUV lithography" or U.S. Pat. No. 6,198,793 with the title "Illumination system particularly for EUV lithography", whose disclosure is incorporated herein by reference. Such an illumination system contains an EUV light source 204. The light of the EUV light source is collected by collector mirror 206. The reticle 212 is illuminated by a first mirror 207 containing raster elements—so-called field honeycombs—and a second mirror 208 containing raster elements—so-called pupil honeycombs—as well as a mirror 210. The light reflected from reticle 212 is imaged onto a carrier 214 having a light-sensitive layer by a projection objective according to the invention.

The invention provides for the first time a projection objective with six mirrors, comprising off-axis segments with small dimensions on all mirrors, and, therefore provides a particularly advantageous, compact projection objective from the point of view of technical construction and technical manufacturing.

List of References

Z: enveloping circle

6, 8: points at which the enveloping circle coincides with the kidney-shaped projected field

10: edge of the kidney-shaped projected field

11: object field

12: axis of symmetry of the ring field

15: central point of the object or image field

20, 22: mirror segments

26, 28: volume claim

30, 32: central point of the off-axis segment

100: object plane

102: image plane

200: imaging beam bundle

202: upper edge of the off-axis segment N5 at S5

204: lower-edge rays

206: upper-edge rays

S1: first mirror

S2: second mirror

S3: third mirror

S4: fourth mirror

S5: fifth mirror

S6: sixth mirror

B1, B2, B3, B4, B5, B6: volume claims assigned to the mirrors

N1, N2, N3, N4, N5, N6: off-axis segments assigned to the mirrors x, y, z: coordinates of the coordinate system in the object and image planes HA: optical axis of the projection objective NA: numerical aperture at the exit pupil R: ring-field radius CR: chief ray B: diaphragm, aperture stop Z: intermediate image D: diameter of the off-axis segment

What is claimed is:

1. Microlithography projection objective for short wavelengths, with an entrance pupil and an exit pupil for imaging an object field into an image field in an image plane, which represents a segment of a ring field, wherein the segment has an axis of symmetry and an extension perpendicular to the axis of symmetry and the extension is at least 20 mm, comprising:

a first (S1), a second (S2), a third (S3), a fourth (S4), a fifth (S5 ) and a sixth mirror (S6) in centered arrangement relative to an optical axis, wherein each of these mirrors have an off-axis segment, in which the light beams traveling through the projection objective impinge, and wherein the diameter of the off-axis segment of the first, second, third, fourth, fifth and sixth mirrors as a function of the numerical aperture NA of the objective at the exit pupil is ≦(1200 mm*NA), wherein the first, second, third, fourth, fifth and sixth mirrors each have a volume claim on the rear side of the mirror, which has a depth parallel to the optical axis measured from the front side of the mirror in the off-axis segment, wherein the depth of the volume claims of the first, second, third, fourth, and sixth mirrors is at least 50 mm, and the depth of the volume claim of the fifth mirror is greater than ⅓ the value of the diameter of the fifth mirror, and wherein the respective volume claims are not penetrated.

2. Microlithography projection objective according to claim 1, wherein all volume claims can be extended in a direction parallel to the axis of symmetry without intersecting the light path in the objective or the volume claim of another mirror.

3. Microlithography projection objective according to claim 1, wherein the first, second, third, fourth, fifth and sixth mirrors include an edge region encircling the off-axis segment, and the edge region amounts to more than 4 mm, and wherein the light is guided in the objective free of obscuration.

4. Microlithography projection objective according to claim 1, wherein the off-axis segment of the fourth mirror is arranged geometrically between the second mirror and the image plane.

5. Microlithography projection objective according to claim 1, wherein the fourth mirror is arranged geometrically between the third and the second mirrors.

6. Microlithography projection objective according to claim 1, wherein the fourth mirror is arranged geometrically between the first and the second mirrors.

7. Microlithography projection objective according to claim 1, wherein the distance of the mirror vertex along the optical axis from the fourth to the first mirrors (S4 S1) relative to the distance from the second to the first mirror (S2 S1) lies in the range:

$$0.1<(\mathbf{S4\ S1})/(\mathbf{S2\ S1})<0.9.$$

8. Microlithography projection objective according to claim 1, wherein the distance of the mirror vertex along the optical axis from the third to the fourth mirror (S3 S4) relative to the distance from the second to the third mirror (S2 S3) lies in the range:

0.3<(S3 S4)/(S2 S3)<0.9.

9. Microlithography projection objective according to claim 1, wherein the central ring-field radius R, as a function of the numerical aperture NA at the exit pupil, the distance of the mirror vertex along the optical axis from the fifth to the sixth mirror (S5 S6), the distance of the mirror vertex of the fifth mirror from the image plane (S5 B), and the radii of curvature $r_5$, $r_6$ of the fifth and sixth mirrors is:

$$R \geq \tan(\text{arc }\sin(NA)) * \left[(S5\ B) + (S5\ S6) - \frac{1}{\frac{2}{r_6} - \frac{1}{r_5 + (S5\ S6)}}\right].$$

10. Microlithography projection objective according to claim 1, further comprising an angle of incidence of a chief ray of a field point, wherein the field point lies on the axis of symmetry in the center of the object field, and wherein the angle of incidence is <18° on all mirrors.

11. Microlithography projection objective according to claim 1, wherein an intermediate image is formed in the projection objective in the light direction after the fourth mirror (S4).

12. Microlithography projection objective according to claim 1, further comprising a diaphragm (B) that is arranged in a light path or a beam path on the second mirror (S2).

13. Microlithography projection objective according to claim 1, wherein the first mirror is made convex, and the first, second, third, fourth, fifth and sixth mirrors are aspheric.

14. Microlithography projection objective according to claim 1, wherein the first mirror has zero base curvature, and the first, second, third, fourth, fifth and sixth mirrors are aspheric.

15. Microlithography projection objective according to claim 1, wherein the first mirror is concave, and the first, second, third, fourth, fifth and sixth mirrors are aspheric.

16. Microlithography projection objective according to claim 1, wherein all mirrors are aspheric.

17. Microlithography projection objective according to claim 1, wherein five mirrors at most are aspheric.

18. Microlithography projection objective according to claim 17, wherein the fourth mirror is spherical.

19. Microlithography projection objective according to claim 17, wherein the second mirror (S2) to the sixth mirror (S6) are configured in the sequence: concave—convex—concave—convex—concave, respectively.

20. Microlithography projection objective according to claim 17, wherein the objective is telecentric on the image side.

21. Projection exposure system, comprising:

an illumination device for illuminating a ring field; and a projection objective according to claim 1.

22. Process for chip manufacture comprising using a projection exposure system according to claim 21.

23. Microlithography projection objective for short wavelengths, with an entrance pupil and an exit pupil for imaging an object field into an image field in an image plane, which represents a segment of a ring field, wherein the segment has an axis of symmetry and an extension perpendicular to the axis of symmetry and the extension is at least 20 mm, comprising:

a first (S1), a second (S2), a third (S3), a fourth (S4), a fifth (S5 ) and a sixth mirror (S6) in centered arrangement relative to an optical axis, wherein each of these mirrors have an off-axis segment, in which the light beams traveling through the projection objective impinge, and wherein the diameter of the off-axis segment of the first, second, third, fourth, fifth and sixth mirrors as a function of the numerical aperture NA of the objective at the exit pupil is ≦(1200 mm*NA), and wherein the central ring-field radius R, as a function of the numerical aperture NA at the exit pupil, the distance of the mirror vertex along the optical axis from the fifth to the sixth mirror (S5 S6), the distance of the mirror vertex of the fifth mirror from the image plane (S5 B), and the radii of curvature $r_5$, $r_6$ of the fifth and sixth mirrors is:

$$R \geq \tan(\text{arc }\sin(NA)) * \left[(S5\ B) + (S5\ S6) - \frac{1}{\frac{2}{r_6} - \frac{1}{r_5 + (S5\ S6)}}\right].$$

* * * * *